(12) United States Patent  
Kurosawa

(10) Patent No.: US 7,542,141 B2  
(45) Date of Patent: Jun. 2, 2009

(54) STAGE CONTROLLER AND EXPOSURE METHOD IN WHICH POSITION OF THE STAGE IS CONTROLLED BASED ON POSITION MEASUREMENTS OF FIRST AND SECOND LASER INTERFEROMETERS

(75) Inventor: Hiroshi Kurosawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/179,734

(22) Filed: Jul. 25, 2008

(65) Prior Publication Data

US 2008/0304064 A1 Dec. 11, 2008

Related U.S. Application Data

(63) Continuation of application No. 10/374,141, filed on Feb. 27, 2003, now Pat. No. 7,411,678.

(30) Foreign Application Priority Data

Mar. 1, 2002 (JP) .............................. 2002-056419

(51) Int. Cl.
| G01B 11/00 | (2006.01) |
| G01B 11/02 | (2006.01) |
| G03B 27/32 | (2006.01) |
| G03C 5/00 | (2006.01) |

(52) U.S. Cl. ......................... 356/399; 356/508; 355/77; 430/30

(58) Field of Classification Search ........................ None
See application file for complete search history.

(56) References Cited

U.S. PATENT DOCUMENTS 3,634,682 A 1/1972 Gold ........................... 250/201

(Continued)

FOREIGN PATENT DOCUMENTS

JP 10-289943 10/1998

(Continued)

OTHER PUBLICATIONS

Japanese Office Action dated Oct. 6, 2006, issued in corresponding Japanese patent application No. 2002-56419.

*Primary Examiner*—Gregory J Toatley, Jr.
*Assistant Examiner*—Gordon J Stock, Jr.
(74) *Attorney, Agent, or Firm*—Fitzpatrick, Cella, Harper & Scinto

(57) ABSTRACT

An apparatus including a stage configured to be moved. A first laser interferometer measures a position of the stage in a first direction. A second laser interferometer measures a position of the stage in the first direction. A control unit (i) obtains a position of the stage based on an output of one of the first and second laser interferometers, (ii) controls a position of the stage based on the obtained position of the stage, (iii) performs switching of one of the first and second laser interferometers to the other of the first and second laser interferometers while the stage is moved at a constant velocity in the first direction, (iv) calculates a distance by which the stage is to be moved during a time interval, and (v) sets an initial value of the other of the first and second laser interferometers after the switching, based on a position measured by the one of the first and second laser interferometers at a start time of the time interval and the calculated distance.

10 Claims, 14 Drawing Sheets

U.S. PATENT DOCUMENTS

| | | | |
|---|---|---|---|
| 4,742,286 A * | 5/1988 | Phillips | 355/53 |
| 5,112,133 A | 5/1992 | Kurosawa et al. | 356/401 |
| 5,150,152 A * | 9/1992 | Isohata et al. | 355/53 |
| 5,182,615 A | 1/1993 | Kurosawa et al. | 356/400 |
| 5,523,841 A | 6/1996 | Nara et al. | 356/358 |
| 5,661,388 A | 8/1997 | Kurosawa | 318/625 |
| 5,699,146 A * | 12/1997 | Kaminaga | 355/53 |
| 5,721,608 A * | 2/1998 | Taniguchi | 355/53 |
| 6,008,882 A * | 12/1999 | Ito et al. | 355/53 |
| 6,495,847 B1 | 12/2002 | Asano et al. | 250/548 |
| 6,785,005 B2 * | 8/2004 | Inoue | 356/500 |
| 6,842,248 B1 | 1/2005 | Binnard et al. | 356/401 |
| 6,879,382 B2 * | 4/2005 | Akutsu et al. | 355/67 |
| 6,897,963 B1 * | 5/2005 | Taniguchi et al. | 356/500 |
| 7,016,049 B2 | 3/2006 | Kurosawa | 356/508 |
| 7,042,576 B2 | 5/2006 | Hattori | 356/500 |
| 7,280,225 B2 | 10/2007 | Akimoto | 356/500 |
| 2001/0001577 A1 * | 5/2001 | Ukaji | 356/500 |
| 2002/0109850 A1 | 8/2002 | Takai et al. | 356/500 |
| 2003/0035093 A1 | 2/2003 | Peterson et al. | 355/72 |
| 2003/0133125 A1 | 7/2003 | Hattori | 356/500 |

FOREIGN PATENT DOCUMENTS

| | | |
|---|---|---|
| JP | 11-325832 | 11/1999 |
| JP | 2000-187338 | 7/2000 |
| JP | 2001-059704 | 3/2001 |

* cited by examiner

STAGE CONTROLLER AND EXPOSURE METHOD IN WHICH POSITION OF THE STAGE IS CONTROLLED BASED ON POSITION MEASUREMENTS OF FIRST AND SECOND LASER INTERFEROMETERS

This application is a continuation application of U.S. patent application Ser. No. 10/374,141, filed Feb. 27, 2003, now U.S. Pat. No. 7,411,678.

This application also claims the benefit of Japanese Patent Application No. 2002-056419, filed Mar. 1, 2002, which is hereby incorporated by reference herein in its entirety.

FIELD OF THE INVENTION

The present invention relates to an alignment apparatus, a control method thereof, an exposure apparatus, and a method of manufacturing a semiconductor device by an exposure apparatus controlled by the same control method.

BACKGROUND OF THE INVENTION

Along with the development of today's information-oriented society, the integration degree of a device, a circuit, and the like, has been rapidly increasing in recent years. This is realized by the development of micropatterning techniques. For example, Japanese Patent Laid-Open No. 10-289943 discloses a system which controls a stage using a laser interferometer. In this system, an interferometer, which measures the position of the stage, generally has one measurement axis per one degree of freedom of a movable shaft.

To increase the stroke of the stage in this system, the size of a mirror for an interferometer to be attached to the stage, however, needs to be increased, thereby decreasing the dynamic characteristics of the control system of the stage. Additionally, for example, if an interferometer is set in an exposure apparatus to perform measurement in a focus direction, it is geometrically difficult due to the arrangement relationship with a projection lens to arrange one optical axis, such that the entire movable range of the stage is measured while using the optical axis of the interferometer.

Under these circumstances, in Japanese Patent Laid-Open No. 2000-187338, a plurality of laser interferometers are provided for one axis of the driving stroke of the stage of an exposure apparatus, and switching is performed between the interferometers in off-axis alignment measurement and in exposure, thereby attempting to reduce the weight of a mirror of the interferometer. To measure the position of a stage by switching between two interferometers, a stroke is set within which the two interferometers can simultaneously perform position measurement, and the position measurement value of one interferometer, as the switching target, is preset to the position measurement value of the other interferometer, which measures the position of the stage within the stroke. The same applies to a case wherein interferometer switching is performed twice or more.

If switching is performed between a plurality of interferometers during stage driving, an error of a certain magnitude proportional to the moving velocity occurs for a period of time during which the position measurement value of one interferometer is read, and the position measurement value of another interferometer is preset to the read position measurement value. Variations in such periods of time cause an error to have an indefinite magnitude, and the error magnitude of the held current position accumulates. To avoid this problem, the number of times of interferometer switching in processing one wafer by an exposure apparatus is minimized, or interferometer switching is performed while a wafer stage is stopped during baseline measurement.

However, an interferometer switching position needs to be arranged at a specific position, such as a baseline measurement position limited by the system. This results in system limits, and thus, for example, interferometer switching cannot be performed during stage driving. Additionally, indefinite times of switching (chattering), due to background vibrations of a stage, depending on the stop position, may occur.

SUMMARY OF THE INVENTION

The present invention has been made in consideration of the above-mentioned problems, and has as its object to provide, e.g., an alignment apparatus and its control method which suppress errors caused by the switching of measuring devices during stage driving, an exposure apparatus, and a method of manufacturing a semiconductor device by an exposure apparatus controlled by the same control method.

According to the first aspect of the present invention, an alignment apparatus, which drives to a target position a stage capable of moving at least in a two-dimensional direction, comprises a plurality of position measurement devices, which have a function of measuring a position of the stage in one direction simultaneously from different positions, a switching device which switches from one of the plurality of position measurement devices, which simultaneously measure the position of the stage, to another, on the basis of at least one of position information and velocity information of the stage, and a setting device, which sets an initial value of a second position measurement device after switching, on the basis of the position of the stage measured by a first position measurement device before switching, when the switching device switches between the position measurement devices, wherein the switching device switches between the position measurement devices during driving of the stage.

According to a preferred embodiment of the present invention, the apparatus further comprises a first computing unit, which calculates a moving velocity of the stage on the basis of a measurement result of the position measurement devices, a time measurement device which measures an execution time from when the first position measurement device, before switching, measures the position of the stage to when the initial value of the second position measurement device, after switching, is set, and a second computing unit, which calculates a product of the moving velocity calculated by the first computing device and the execution time measured by the time measurement device, and the setting device sets, to the initial value of the second position measurement device, after switching, a value obtained by adding the product to the position of the stage measured by the first position measurement device before switching, when the switching device switches between the position measurement devices.

According to a preferred embodiment of the present invention, the switching device switches between the position measurement devices when the stage is moving at a constant velocity.

According to a preferred embodiment of the present invention, when a position at which the stage moves at the constant velocity changes in accordance with the target position, a switching position of the position measurement devices is changed, such that switching between the position measurement devices is performed at the position where the stage moves at the constant velocity.

According to a preferred embodiment of the present invention, at least one of a driving acceleration and a driving velocity of the stage is adjusted to change a track and the target position, when the stage is driven, such that switching between the position measurement devices is performed at the position at which the stage moves at the constant velocity.

According to a preferred embodiment of the present invention, the apparatus has a function of driving the stage to the target position before a change.

According to a preferred embodiment of the present invention, the switching device switches between the position measurement devices, to measure the position of the stage in the direction when the stage is kept stopped in the direction.

According to a preferred embodiment of the present invention, the position measurement devices have a function of measuring the position, in a three-dimensional direction, of the stage capable of moving in the three-dimensional direction.

According to the second aspect of the present invention, a method of controlling an alignment apparatus, which drives to a target position a stage capable of moving at least in a two-dimensional direction, comprises a measurement step of measuring a position of the stage in one direction, simultaneously from different positions, using a plurality of position measurement devices, a switching step of switching from one of the plurality of position measurement devices to another, on the basis of at least one of position information and velocity information of the stage, and a setting step of setting an initial value of a second position measurement device, after switching, on the basis of the position measured by a first position measurement device, before switching, when in the switching step, switching between the position measurement devices is performed, wherein, in the switching step, switching between the position measurement devices is performed during driving of the stage.

According to a preferred embodiment of the present invention, in the switching step, switching between the position measurement devices is performed when the stage is moving at a constant velocity.

The third aspect of the present invention is characterized in that an alignment apparatus controlled by a control method of the present invention is used to transfer a pattern.

According to a preferred embodiment of the present invention, in the switching step, switching between the position measurement devices is performed after a lapse of a predetermined delay time or passage through a distance corresponding to the delay time immediately after passage through an area to be exposed.

According to the fourth aspect of the present invention, there is provided a semiconductor device manufacturing method comprising a coating step of coating a substrate with a photosensitive material, an exposure step of transferring a pattern onto the substrate coated with the photosensitive material in the coating step, using an exposure apparatus according to the present invention, and a development step of developing the photosensitive material of the substrate, on which the pattern is transferred in the exposure step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

First Embodiment

Figure 1:
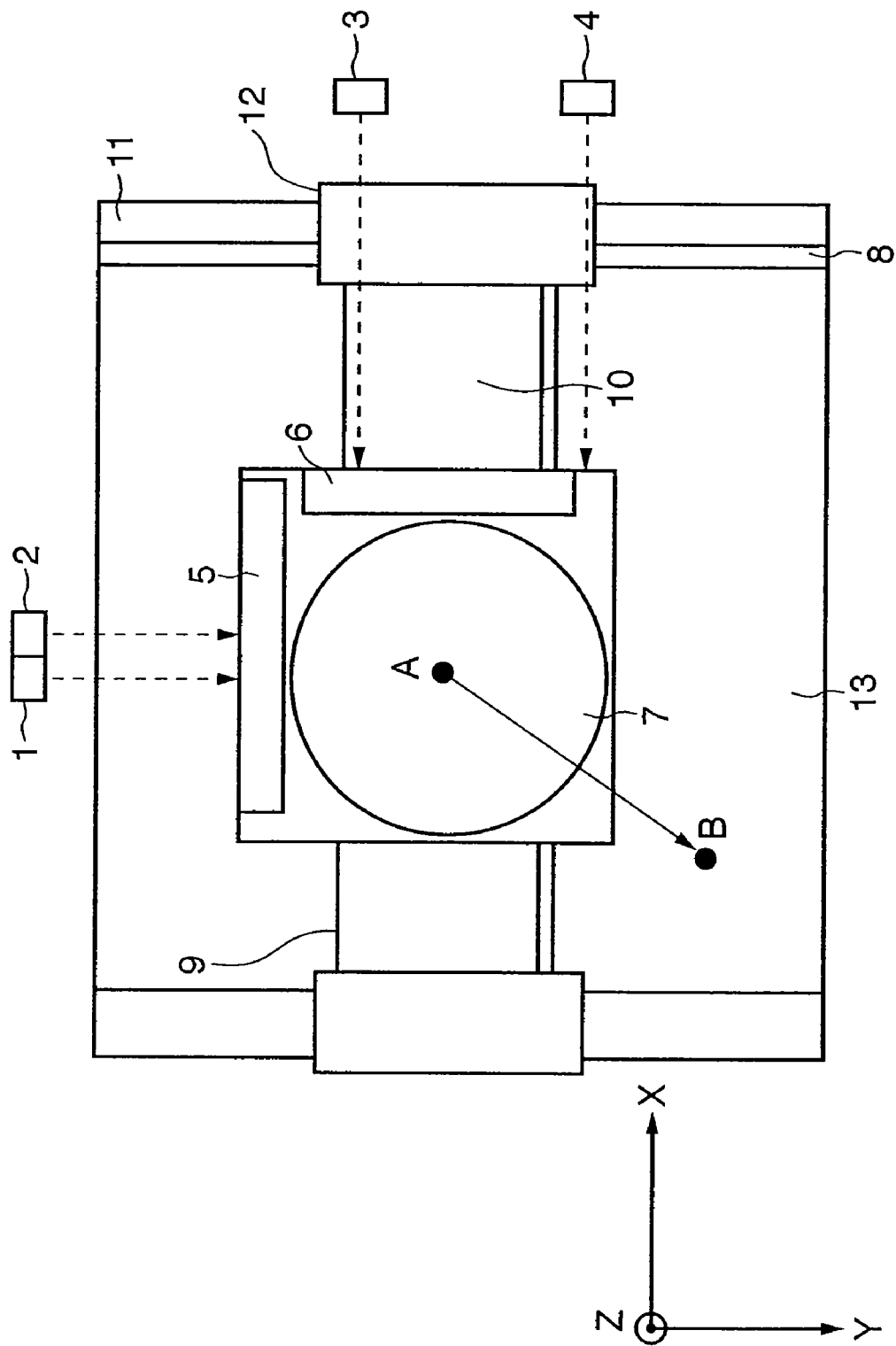
FIG. 1 is a view showing an example of an alignment apparatus according to a preferred embodiment of the present invention.

FIG. 1 is a view showing an example of an alignment apparatus according to a preferred embodiment of the present invention, and particularly, shows a case wherein the alignment apparatus is applied to the wafer stage of a semiconductor exposure apparatus. A Y mirror 5, an X mirror 6, and a wafer chuck (not shown) are mounted on a wafer stage 7. Though, as the wafer stage 7, one capable of driving along the XYθ axes is shown in FIG. 1, for the sake of descriptive simplicity, one capable of driving along six axes may be employed. The X mirror 6 reflects measurement light from an X-axis interferometer 3 or an X-axis interferometer 4, and is used to measure the position coordinate, in the X-axis direction, of the wafer stage 7. The Y mirror 5 reflects measurement light from a Y-axis interferometer 1 and a yawing interferometer 2, and is used to measure the position coordinate, in the Y-axis direction, of the wafer stage 7. A linear motor XLM 10 drives the wafer stage 7 in the X direction and is guided by an X-axis yaw guide 9. A linear motor YLM (stator) 11 drives a YLM (movable element) 12 in the Y direction, and is guided by a Y-axis yaw guide 8. The wafer stage 7 is guided by a flat guide 13, and an interferometer to be used in measurement of the coordinate in the X-axis direction is switched between the X-axis interferometers 3 and 4, depending on the Y-coordinate value of the driven stage. More specifically, if the wafer stage 7 is located near the Y-axis interferometer 1 of FIG. 1, the X mirror 6 does not reach the optical axis of the X-axis interferometer 4, and thus, the X-axis interferometer 3 measures the X-axis position. On the other hand, if the wafer stage 7 is located far from the Y-axis interferometer 1 of FIG. 1, the X-axis interferometer 4 measures the X-axis position for the same reason.

The main object of the present invention is to provide a means which can perform laser interferometer switching and inheritance of measurement values of the current position, with stability at high precision, when laser interferometers for two or more axes are arranged for one degree of freedom of the wafer stage 7.

Figure 2:
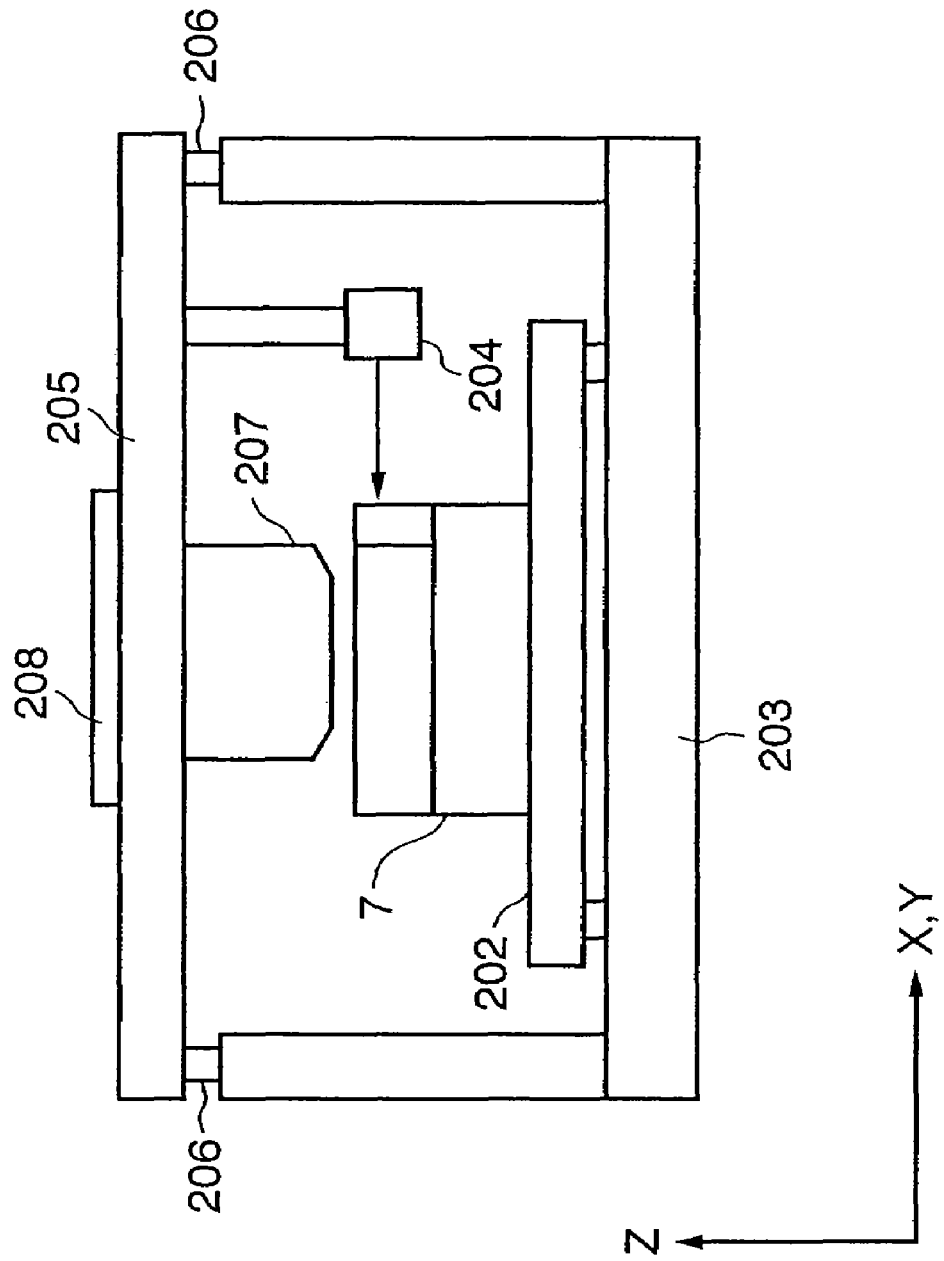
FIG. 2 is a view of the alignment apparatus shown in FIG. 1, as seen from the side.

FIG. 2 is a view of the alignment apparatus shown in FIG. 1, as seen from the side. The position of the wafer stage 7 is measured by an interferometer 204, which is fixed to a lens barrel surface plate 205. The interferometer 204 in FIG. 2 is one of the Y-axis interferometer 1, yawing interferometer 2, X-axis interferometer 3, and X-axis interferometer 4, which are already described with reference to FIG. 1, as seen from the side. The lens barrel surface plate 205 is held by a damper 206 to float above a vibration damping base (pedestal) 203. The lens barrel surface plate 205 is designed not to transfer high-frequency vibrations from the floor to the interferometer 204 and an exposure apparatus projection optical system (not shown). A plurality of interferometers 204 are arranged on the lens barrel surface plate 205 at positions in the Y direction and axial directions along which measurement is to be performed. A stage surface plate 202 is designed not to transfer high-frequency vibrations from the floor to the wafer stage 7, as with the lens barrel surface plate 205. A projection lens 207 is mounted on the lens barrel surface plate 205 and it projects a pattern image from a reticle 208, also mounted on the lens barrel surface plate 205, onto a wafer (not shown) loaded on the wafer stage 7.

Figure 3:
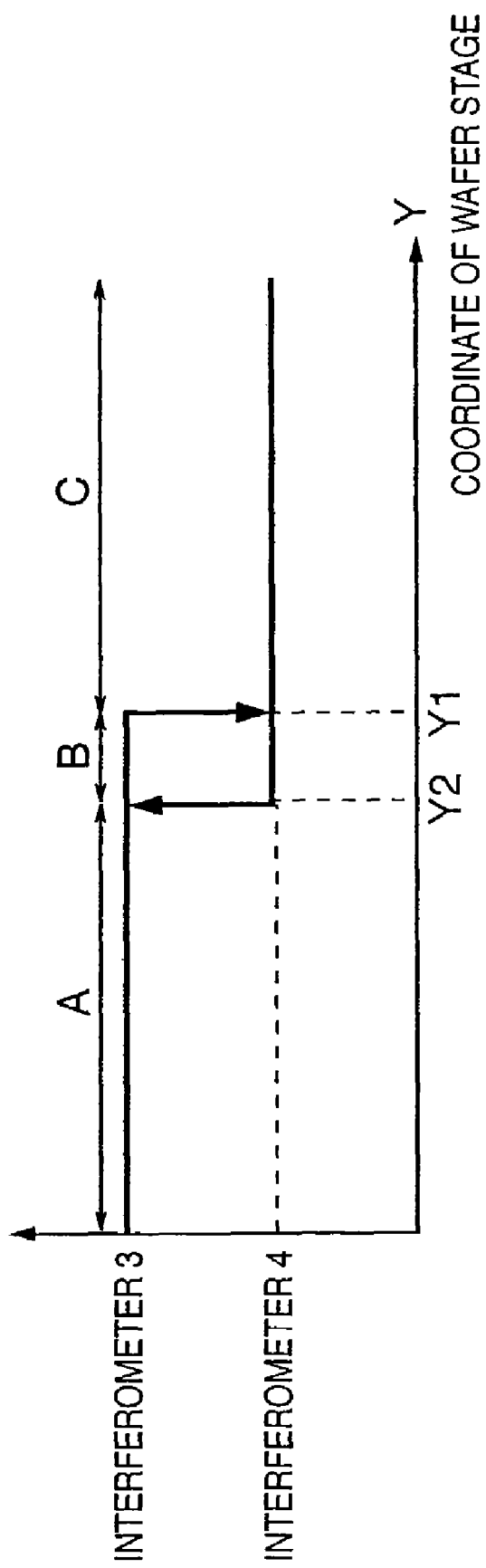
FIG. 3 is a graph showing the relationship between the Y-coordinate and interferometers, whose measurement values are valid in the alignment apparatus according to the preferred embodiment of the present invention.

FIG. 3 is a graph showing the relationship between the measurement axes of interferometers whose measurement values are valid and the Y-coordinate of the wafer stage 7 in the alignment apparatus according to the preferred embodiment of the present invention. If the wafer stage 7 is located near the Y-axis interferometer 1 of FIG. 1, the measurement optical axis of the X-axis interferometer 4 does not strike the X mirror 6, and only the X-axis interferometer 3 measures the current position of the wafer stage 7 (zone A).

If the wafer stage 7 moves to near the center of the driving stroke, measurement light beams of both the X-axis interferometers 3 and 4 strike the X mirror 6. Accordingly, both the X-axis interferometers 3 and 4 can perform position measurement (zone B). If the wafer stage 7 moves from the zone A to the zone B, the current position information to be counted by the X-axis interferometer 4 has a value accumulating from an indefinite value, and thus, is worthless as a measurement value representing the current position of the wafer stage 7. For this reason, when the wafer stage 7 moves from the zone A to the zone B, a measurement value is inherited from the X-axis interferometer 3 to the X-axis interferometer 4. For example, the X-axis interferometer 4 is forcibly set (preset) to have the current position information held by the X-axis interferometer 3, and a relative movement amount of the wafer stage 7 continues to be counted immediately after the inheritance. This can obtain correct position measurement values all over the Y stroke of the wafer stage 7 using the X-axis interferometers 3 and 4. As a position at which the measurement value of the current position is inherited from the X-axis interferometer 3 to the X-axis interferometer 4, coordinates at which position measurement beams of both the X-axis interferometer 3 to be inherited and the inheriting X-axis interferometer 4 simultaneously strike the X mirror 6 must be selected. This also applied to a case wherein a measurement value is inherited from the X-axis interferometer 4 to the X-axis interferometer 3.

If the wafer stage 7 is located far from the Y-axis interferometer 1 of FIG. 1, the measurement optical axis of the X-axis interferometer 3 does not strike the X mirror 6, and only the X-axis interferometer 4 measures the current position of the wafer stage 7 (zone C). When the wafer stage 7 moves from the zone C to the zone D, a measurement value is inherited from the X-axis interferometer 4 to the X-axis interferometer 3 in the same way.

Reference numerals Y1 and Y2 denote a switching position (Y1) where a measurement value is inherited from the X-axis interferometer 3 to the X-axis interferometer 4 and a switching position (Y2) where a measurement value is inherited from the X-axis interferometer 4 to the X-axis interferometer 3, respectively. Y1 and Y2 are preferably set at different positions. This can avoid chattering (undesirable frequent switching of an interferometer to hold a measurement value), which may occur when the target position of the wafer stage 7 is set to a position in the vicinity of a switching position. If the alignment apparatus according to the preferred embodiment of the present invention is to be used for a scanning exposure apparatus, the switching positions Y1 and Y2 may be changed in accordance with the step size in the X direction, such that an interferometer switching position does not appear during scanning exposure in the Y-axis direction.

Figure 4:
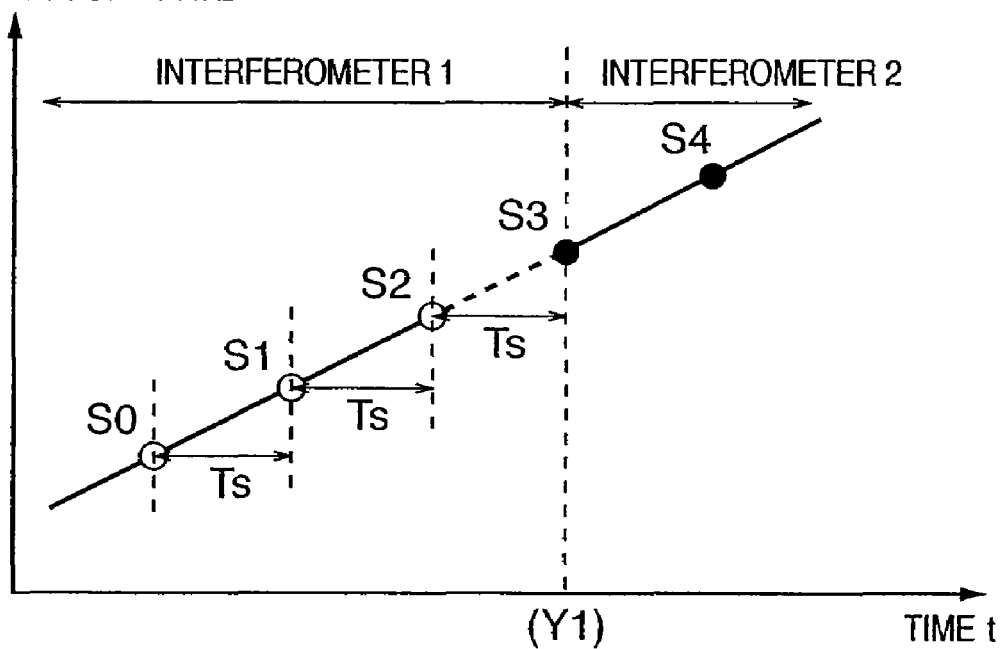
FIG. 4 is a graph showing a method of inheriting the measurement value of the current position in interferometer switching.

FIG. 4 is a graph showing a method of inheriting the measurement value of the current position in interferometer switching. Stage coordinates S0 to S4 represent an example of coordinates of interferometers for every sampling time when the center of the wafer stage 7 moves from a point A to a point B, as shown in FIG. 1. The target position of the wafer stage 7 is set such that, e.g., the wafer stage 7 moves across the switching position Y1 shown in FIG. 3 at a constant velocity. The wafer stage 7, having been moving toward switching position Y1 at a constant velocity at the stage coordinates S0 and S1, approaches the switching position Y1 at the stage coordinate S2. The next stage coordinate S3 is obtained by S2−S1, or the stage moving velocity calculated using previously sampled data (Vs) and sampling time interval (Ts).

$$S3=S2+(S2-S1) \quad (1)$$

or $$S3=S2+Vs*Ts \quad (2)$$

After an interferometer 1 (e.g., the X-axis interferometer 3) obtains a measurement value at S2, an interferometer 2 (e.g., the X-axis interferometer 4) is preset to have the value of S3 obtained by equation (1) or equation (2), at the next sampling timing. With this operation, the current position of the wafer stage 7 measured by the interferometer 1 is inherited to the interferometer 2.

Figure 5:
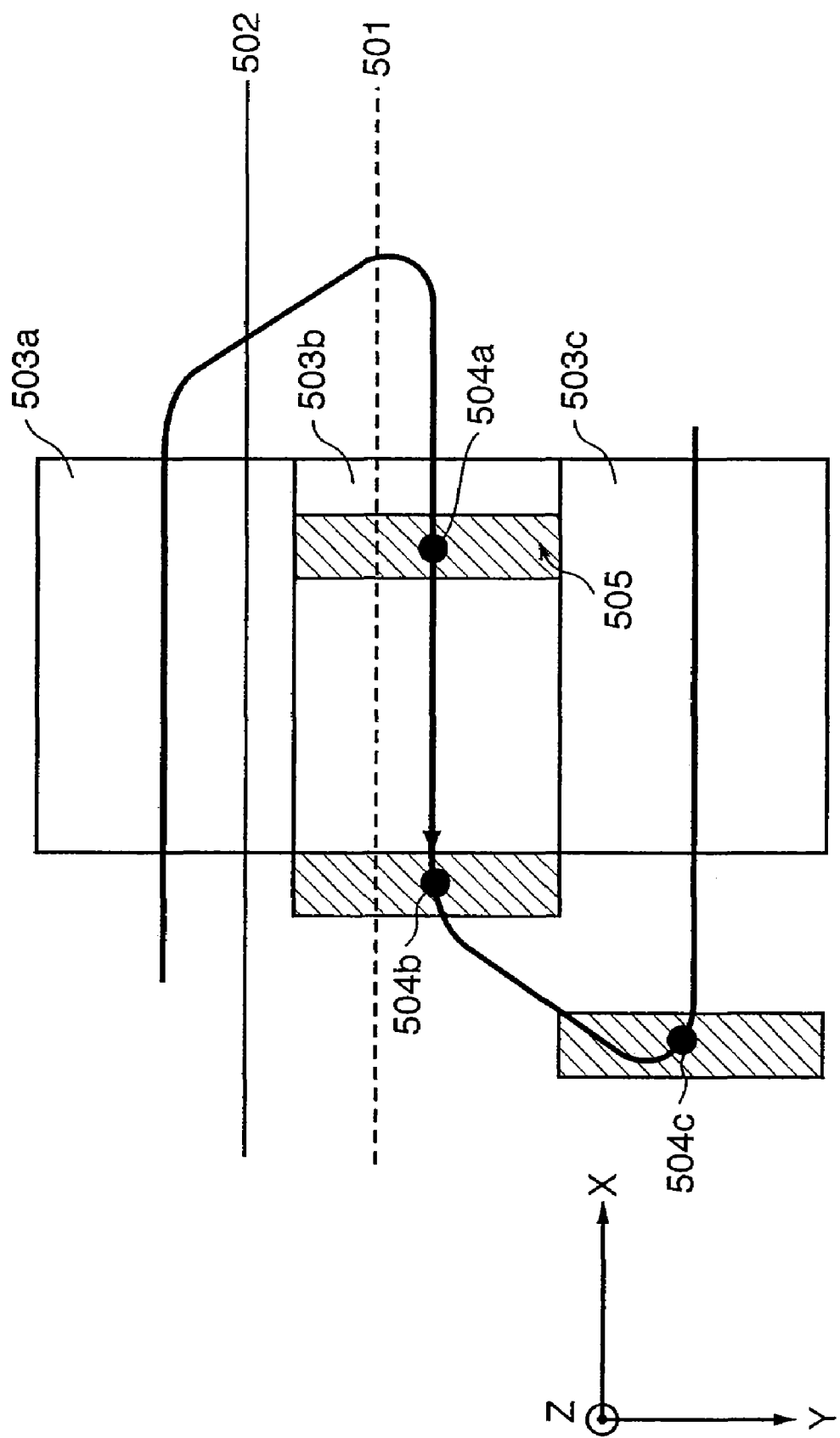
FIG. 5 is a view showing the trajectory of a wafer stage according to the preferred embodiment of the present invention, and the switching coordinates of interferometers.

FIG. 5 is a view showing the trajectory of the wafer stage 7 according to the preferred embodiment of the present invention, and the switching coordinates of interferometers. Reference numerals 503a to 503c show the layout of exposure shots arranged on the wafer. A reticle pattern is transferred onto the wafer, and the wafer is exposed to the pattern through an exposure slit 505. The exposure slit 505 proceeds in parallel with a scan axis (X) during exposure of an exposure shot (504a). When the exposure slit 505 passes through the exposure shot (504b), it is immediately stepped in the Y direction to reach the exposure start position of the next shot (504c). At this time, assume that the Y-coordinate at which interferometer switching is performed is located at a coordinate of a dotted line 501 shown in FIG. 5. Since interferometer switching is performed during acceleration in the Y-axis direction, if the preset position of an interferometer as the switching target is calculated by the method described with reference to FIG. 4, using equation (1) or (2), the magnitude of an error increases.

For this reason, in this case, the Y-coordinate at which interferometer switching is performed is changed to a coordinate indicated by a solid line 502. With this operation, interferometer switching can be performed when an X stage is driven at a constant velocity. To obtain the same effect, a method of changing the maximum velocity so as to cause the wafer stage 7 to move at a constant velocity at an interferometer switching position or changing the processing order of exposure shots to lengthen a Y-step distance may be employed. Alternatively, the wafer stage 7 may be stepped to switch between interferometers, and then stepped again to the original target position, such that a switching point is located in a zone within which the wafer stage 7 moves at a constant velocity. These methods, however, may decrease the flexibility of the exposure processing sequence and the throughput. For this reason, these methods are preferably utilized as countermeasures against a case wherein a distance corresponding to the moving distance of an interferometer switching point cannot be assured in a zone within which at least two Y-axis interferometers are available (the zone B in FIG. 3).

As described in the second preceding paragraph, since it is difficult to estimate the true position of the wafer stage during acceleration and deceleration of the wafer stage, the magnitude of an error increases. More specifically, factors responsible for this include:

(1) present value calculation using an algorithm for creating the stage target track of a profiler 712 increases in complexity depending on the step velocity and target value, and thus, function implementation becomes difficult; and (2) the stage has a deviation from the target value during acceleration and deceleration.

The problem (1) could be solved by employing a processor capable of high-speed mathematical computations for control calculation and improving a present processing algorithm in the future. As for the problem (2), a follow-up deviation in acceleration can be suppressed to a critical level or less by changing the material or structure of the stage to decrease the weight. Therefore, interferometer switching while the stage is moving at a constant velocity, as described in the previous paragraph, is an example which can practically be implemented at the time of the present invention. With an improvement in performance of a processor used for stage control and an improvement in stage structure, a switching function in various states, which include stage constant-velocity movement, but are not limited thereto (e.g., during stage acceleration or deceleration) can be implemented within the scope of the present invention.

Figure 6:
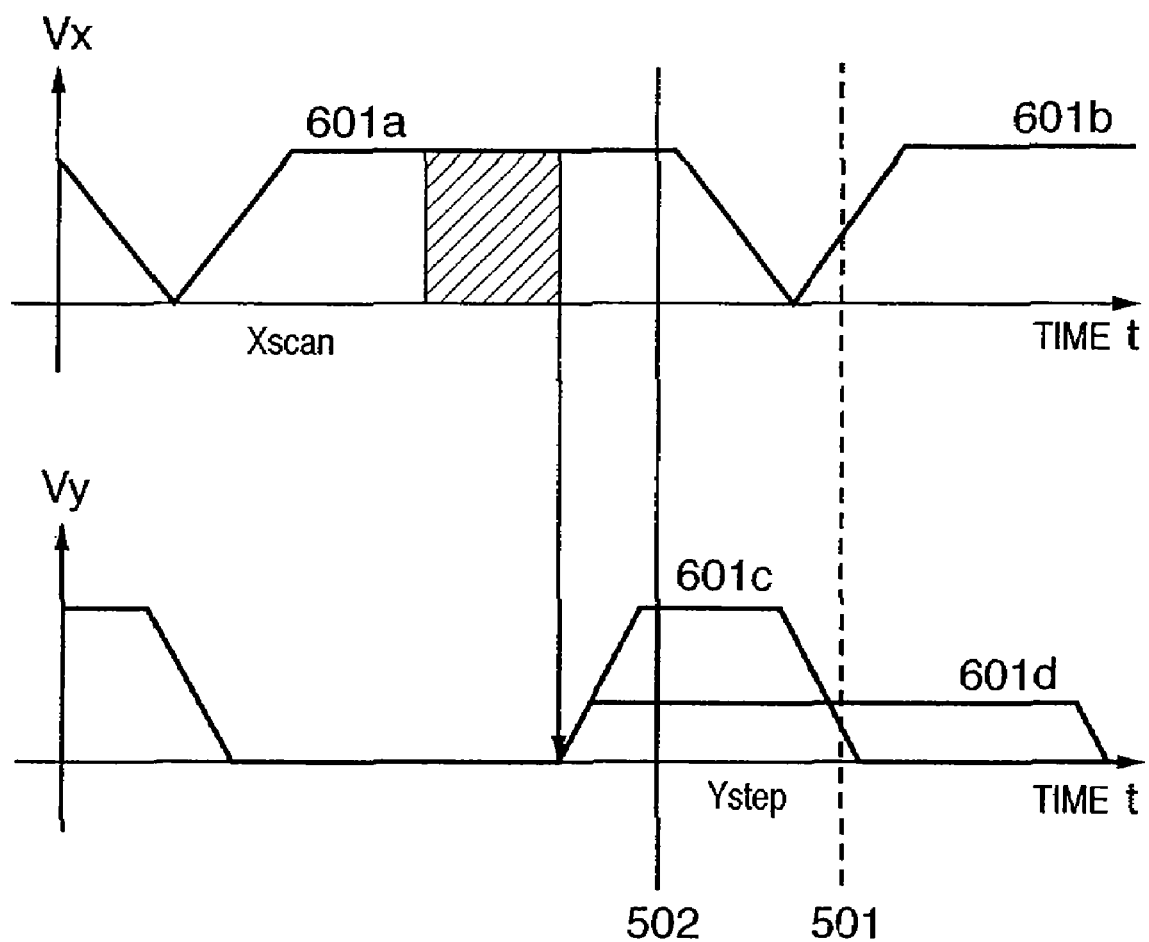
FIG. 6 shows timing charts of the stage driving velocity in the alignment apparatus according to the preferred embodiment of the present invention.

FIG. 6 shows timing charts of the stage driving velocity in the alignment apparatus according to the preferred embodiment of the present invention. Reference numerals 601a and 601b denote X-axis driving profiles when the exposure shots 503a and 503b, as shown in FIG. 5, are exposed, and 601c, a Y-axis driving profile when the wafer stage 7 is Y-stepped from the exposure shot 503a to the exposure shot 503b. Since the interferometer switching point 501 is located in an acceleration phase in the X-axis driving profile, the switching point is shifted to the interferometer switching point 502 located in a constant-velocity phase. At this time, the X-axis driving profile 601b may be delayed and started after movement along the Y-axis ends, instead of shifting the interferometer switching point 501. Alternatively, the maximum velocity of Y-stepping in interferometer switching may be decreased to prolong a period of time for movement at a constant velocity along X- and Y-axes, as indicated by 601d. More specifically, upon completion of processing of the hatched portion of 601a, which represents a scanning exposure zone, stepping along the Y-axis is started for the next exposure operation. By decreasing the maximum velocity in the Y-axis direction to shorten the time required for acceleration, a longer period of time for the transition to movement at a constant velocity along the Y-axis before the start of deceleration along the X-axis as the scan axis can be assured. The same effect can be obtained by prolonging the settling time (a constant-velocity zone other than the hatched area of 601a) during which X-axis scan is performed if interferometer switching occurs.

Figure 7:
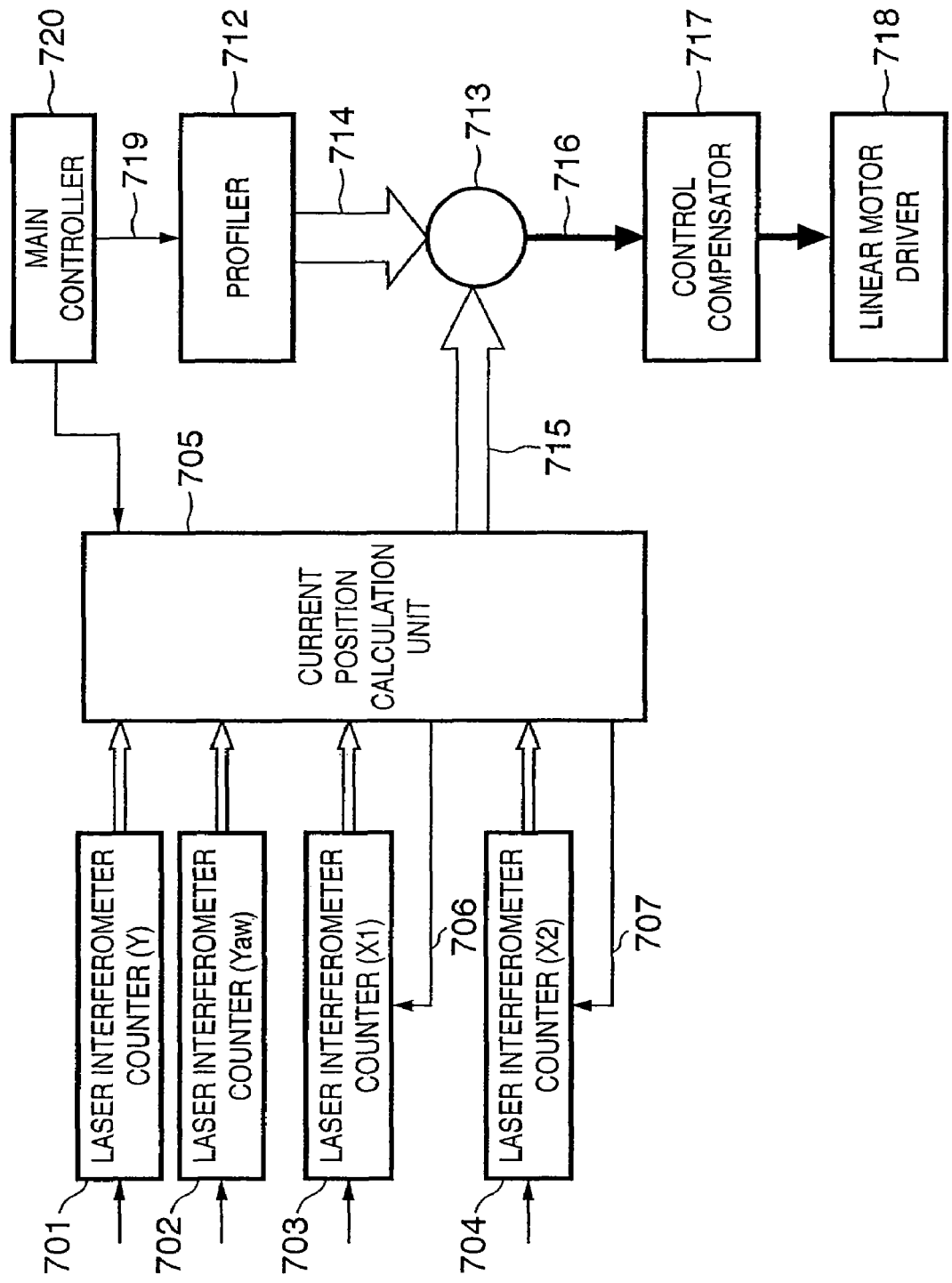
FIG. 7 is a diagram showing the arrangement of a control unit of the alignment apparatus according to the preferred embodiment of the present invention.
Figure 8:
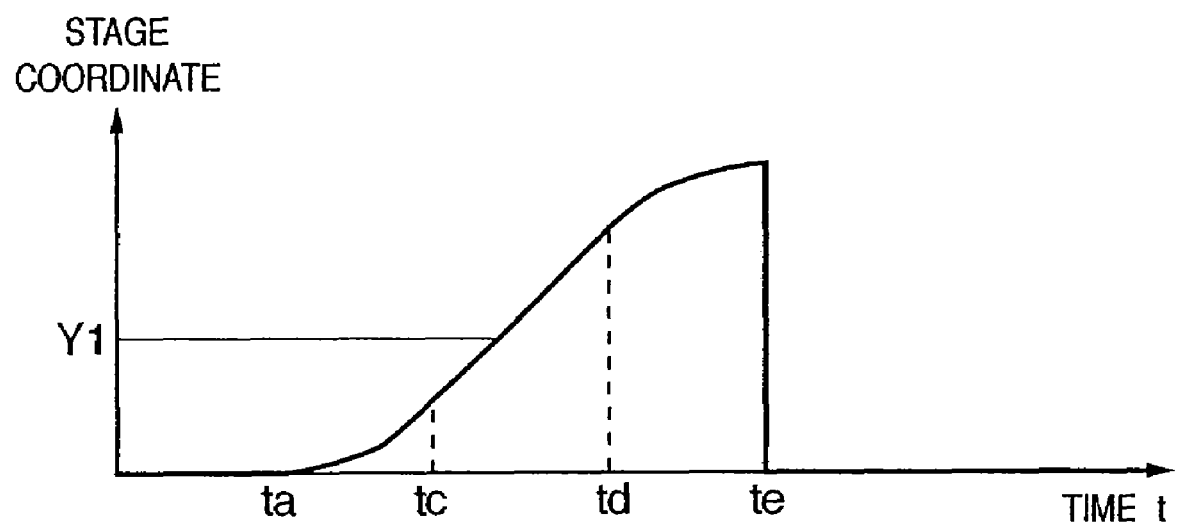
FIG. 8 is a graph showing the step driving waveform of the stage of the alignment apparatus according to the preferred embodiment of the present invention.

FIG. 7 is a diagram showing the arrangement of a control unit of the alignment apparatus according to the preferred embodiment of the present invention. A Y-axis laser interferometer counter 701, yawing-axis laser interferometer counter 702, X-axis laser interferometer counter 703, and X-axis laser interferometer counter 704 separately count the measurement position of the stage. A current position calculation unit 705 transmits preset values 706 and 707 and preset trigger signals (not shown) to the X-axis laser interferometer counters 703 and 704, which perform switching in interferometer switching. A main controller 720 performs processing, such as calculation of the stage target position, designation of interferometer switching points, and the like. The profiler 712 generates, e.g., a profile, as shown in FIG. 8, in which the wafer stage 7 moves toward a target position 719, to reach it while plotting an S-shaped trajectory. In FIG. 8, reference symbol ta denotes an acceleration start point, tc, a point at which driving at a constant velocity is started after termination of the acceleration, td, a deceleration start point, and te, a stop point after termination of the deceleration. The difference between a target value output 714 generated by the profiler 712 and a current position 715 of the wafer stage 7 is calculated by a difference computing unit 713. A deviation 716 obtained by the difference computing unit 713 is converted to a manipulated variable of an actuator by a control compensator 717 and added to a linear motor driver 718.

Second Embodiment

Figure 9:
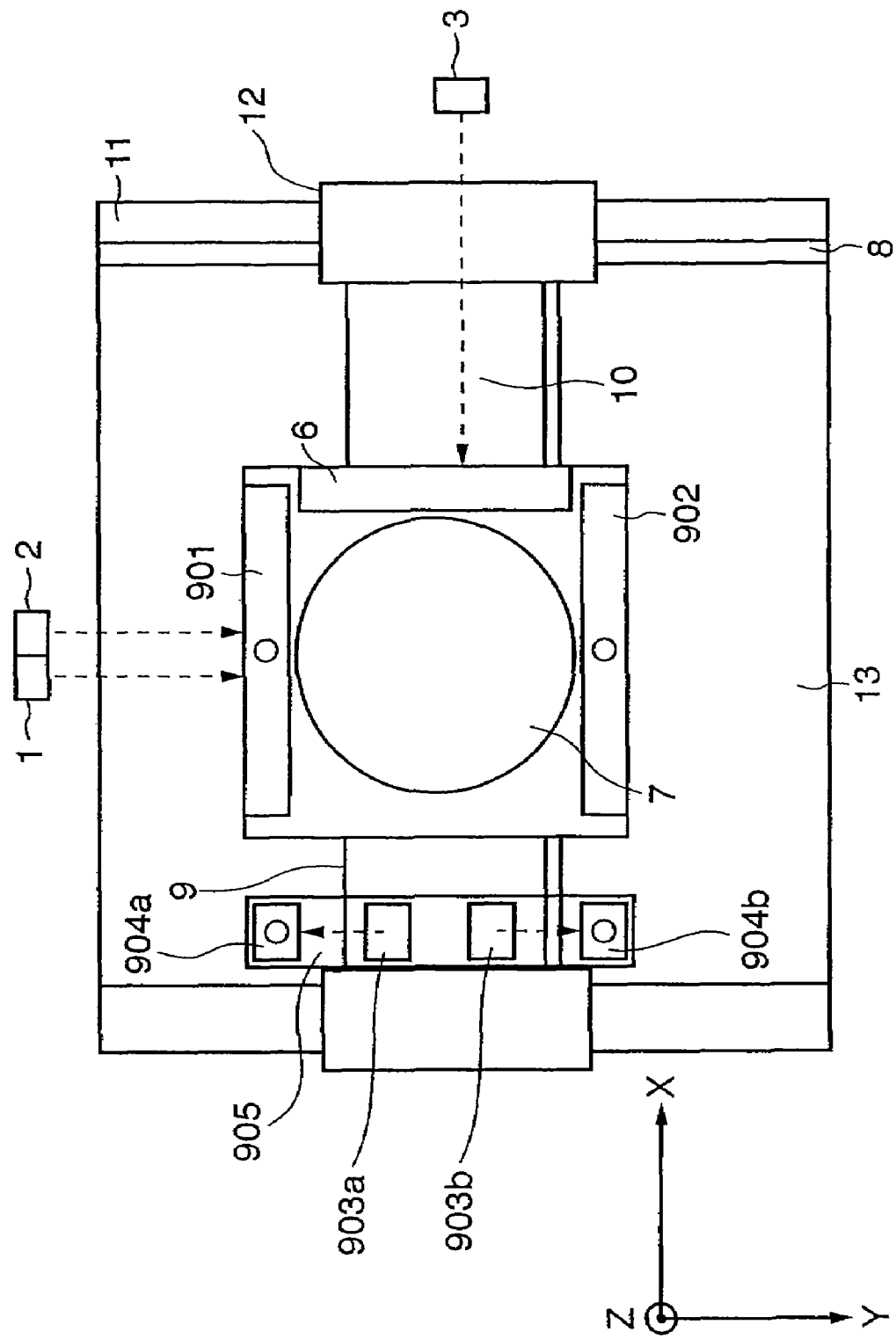
FIG. 9 is a view showing an example of an alignment apparatus according to another preferred embodiment of the present invention.

FIG. 9 is a view showing an example of an alignment apparatus according to another preferred embodiment of the present invention, and, particularly, shows a case wherein the alignment apparatus is applied to the wafer stage of a semiconductor exposure apparatus. The same reference numerals denote parts with the same functions as those in the first embodiment. The difference from the alignment apparatus of FIG. 1 lies in that a plurality of interferometer axes are arranged with respect to the X-axis in FIG. 1, while a plurality of interferometer axes are arranged with respect to the Z-axis. The Y mirror 5 in FIG. 1 corresponds to a YZ1 mirror 901 in FIG. 9, and the YZ1 mirror 901 is also used as a bar mirror, which reflects measurement light of the first Z-axis laser interferometer located in the Z-axis direction of FIG. 9. In addition, a Z2 mirror 902 is arranged on the opposite side of the YZ1 mirror 901 to reflect measurement light of the second Z-axis laser interferometer. Measurement light beams from the Z-axis laser interferometers are introduced to optical pickups 903a and 903b through optical fibers (not shown). The measurement light beams emitted from the optical pickups 903a and 903b are reflected by cube mirrors 904a and 904b in the Z-axis direction. A Z-axis optical system mount 905 is fixed on an XLM 10. When a wafer stage 7 is driven along the Y-axis, the Z-axis optical system mount 905 simultaneously moves in the Y direction.

Figure 10:
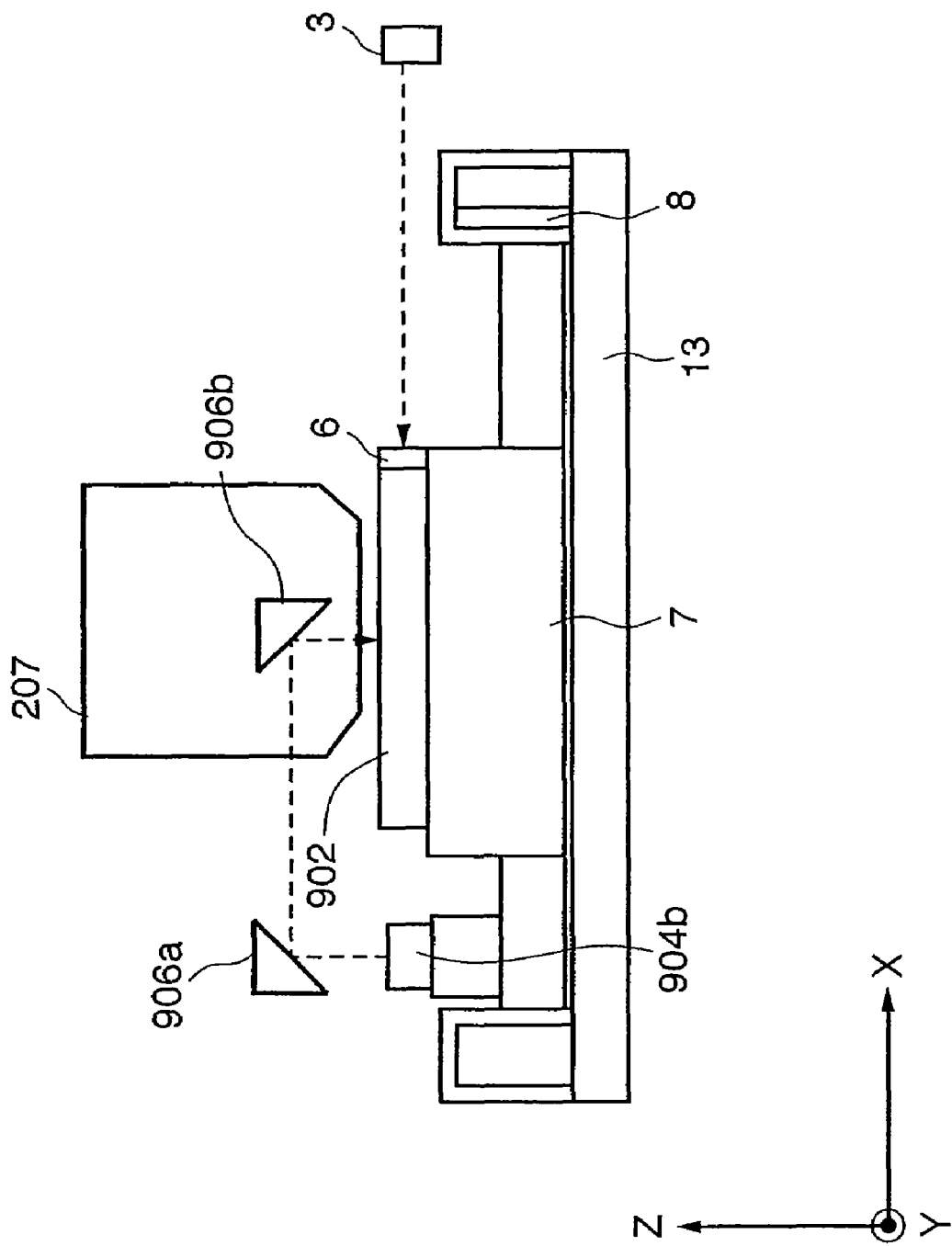
FIG. 10 is a view of the alignment apparatus shown in FIG. 9, as seen from the side.

FIG. 10 is a view of the alignment apparatus shown in FIG. 9, as seen from the side. The Z-axis interferometer measurement light beams reflected by the cube mirrors 904a and 904b in the Z-axis direction are deflected in a direction perpendicular to the incident direction by triangular mirrors 906a and 906b to reach the YZ1 mirror 901 and Z2 mirror 902. The triangular mirrors 906a and 906b are arranged at fixed positions with respect to a projection lens 207, and a spot position illuminated with measurement light moves in the Y-axis direction by the Y-direction driving of the wafer stage 7. A triangular mirror 906b is also arranged at the back of the sheet surface and symmetrically with the projection lens 207, and deflects interferometer measurement light for measuring the YZ1 mirror 901. In this embodiment, the projection lens 207 needs to be arranged near the center of the stage driving stroke. When a laser interferometer attempts to perform measurement along the Z-axis, the measurement optical axis of the laser interferometer, which perform the Z-axis measurement using the projection lens 207, is blocked by the projection lens 207. Accordingly, interferometer switching must be performed within the driving stroke of the wafer stage 7. A method of switching between interferometers while the wafer stage 7 is in a stationary state has been proposed. This method stops the wafer stage 7 over and over during exposure and alignment sequences, thereby decreasing the throughput of the apparatus. According to this embodiment, measurement axis switching of Z-axis interferometers can be performed during driving of the wafer stage 7, and thus, a reduction in throughput caused by stationary switching of interferometer measurement axes can be avoided.

Figure 11:
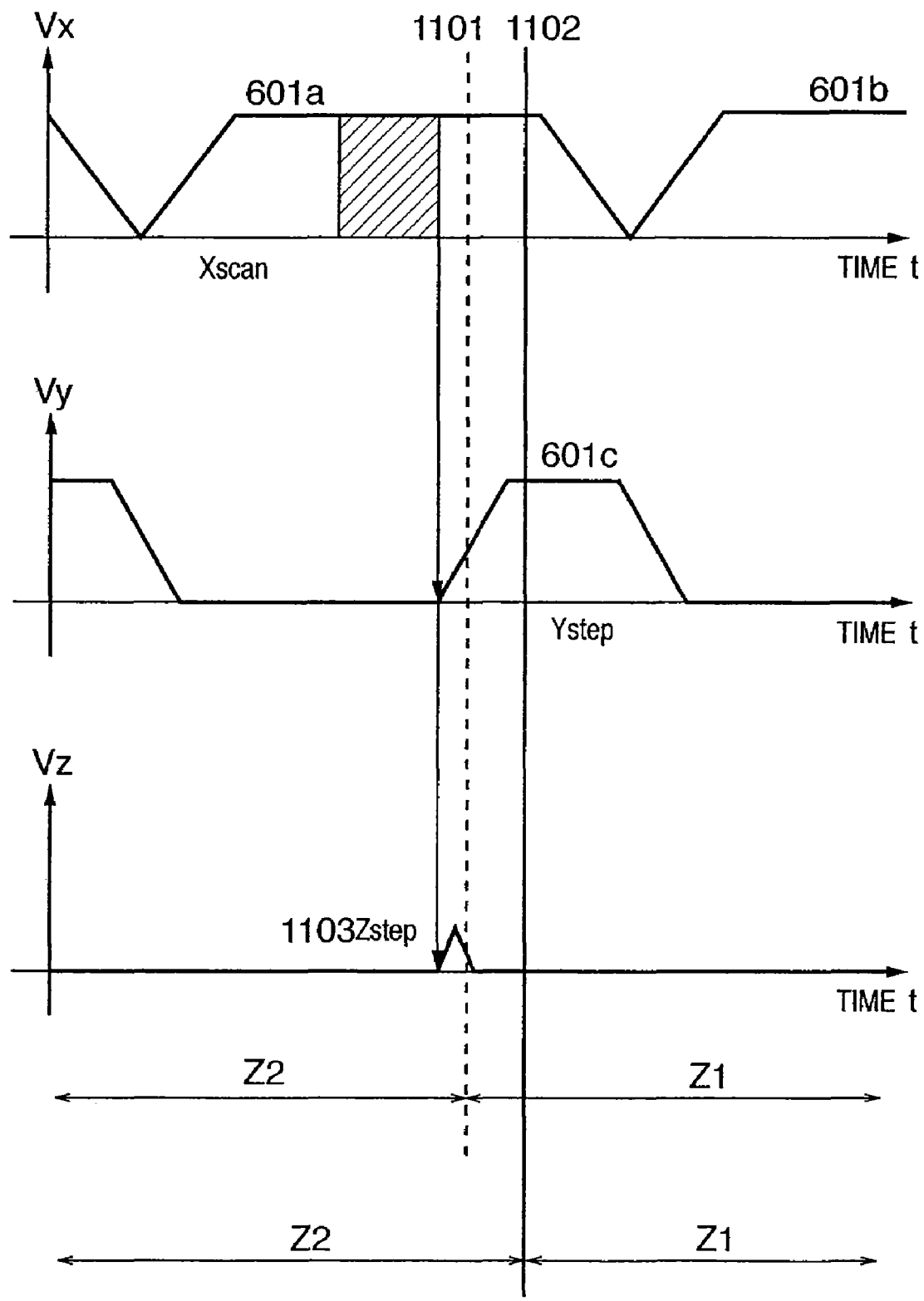
FIG. 11 shows timing charts of the stage driving velocity of the alignment apparatus shown in FIG. 9.

FIG. 11 shows timing charts of the stage driving velocity of the alignment apparatus shown in FIG. 9. When an exposure slit passes through an exposure zone corresponding to a hatched portion during a scan 601a in the X direction, stepping in the Y and Z directions is started immediately. Assume that Y step (601c) extends across a default interferometer switching position 1101. In this case, a measurement value along the Z-axis is obtained by an interferometer Z2 in a region on the left side of the interferometer switching position 1101 and is obtained by an interferometer Z1 in a region on the right side of the interferometer Z1 in a region on the right side of the interferometer switching position 1101. In the driving charts shown in FIG. 11, interferometer switching is performed during deceleration along the Z-axis. When a measurement value switching method using the interferometers described with reference to FIG. 4 is to be employed, the magnitude of an error which may occur in inheritance of measurement values increases. For this reason, in the case of this arrangement, the interferometer switching position is changed to a position 1102 to stop the driving along the Z-axis. At the same time, the interferometer measurement axis is switched from Z2 to Z1 at a timing at which Y-axis driving is being performed at a constant velocity. For the interferometer switching position, a position at which Y step (601c) starts and the stroke vary, depending on the shot layout of a wafer to be processed. Hence, the optimum interferometer switching position is desirably changed to a value determined in consideration of the above-described points of view in accordance with the step direction, step target value, and timing of stepping along the Z-axis. Since the driving distance along the Z-axis is generally short in an exposure apparatus, stepping along the Z-axis terminates in a short time. Accordingly, if Z interferometer measurement axes need to be switched in Y-stepping to the next shot (601c), interferometer switching may be performed at a predetermined delay period of time after the end of an exposure zone in 601a.

As has been described above, according to the present invention, if a plurality of interferometers are provided for one axis, the operating amount of a stage during a time when the second interferometer is forcibly preset to have the current position is held by the first interferometer. With this operation, errors which may occur in switching measurement apparatuses during stage driving can be suppressed. Additionally, a position or timing at which the switching operation is performed is changed in accordance with the driving pattern of the stage, and interferometer switching is performed during stage driving (e.g., when the stage is driven at a constant velocity), thereby obviating the need for the overhead time due to interferometer switching and assuring the switching precision. This can obviate the need for a period of time required to switch between interferometers and suppress errors, which may be caused by switching in an application such as an exposure apparatus.

Moreover, chattering, which may occur when the target position is set to be near a switching position, can be avoided. This can minimize the number of times of interferometer switching and suppress accumulation of errors in switching. In addition, the number of times of calibration for eliminating such cumulative errors can be reduced.

Other Embodiment

An embodiment in which an alignment apparatus according to the present invention is applied to an exposure apparatus used in the manufacturing process of a semiconductor device will be described next.

Figure 12:
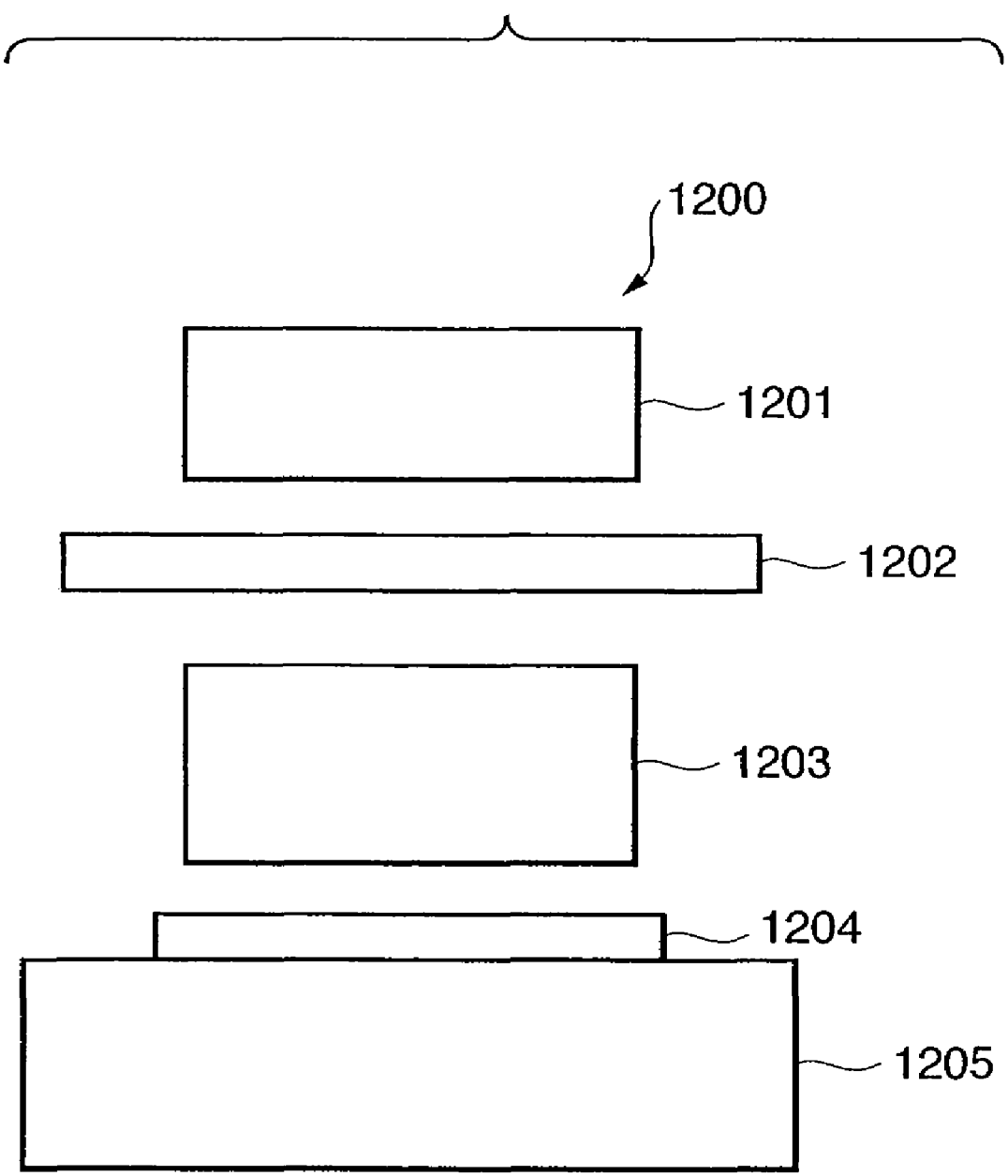
FIG. 12 is a view showing the concept of an exposure apparatus used when an alignment apparatus of the present invention is applied to a semiconductor device manufacturing process.

FIG. 12 is a view showing the concept of an exposure apparatus used when an alignment apparatus of the present invention is applied to a semiconductor device manufacturing process.

An exposure apparatus 1200 according to a preferred embodiment of the present invention includes an illumination optical system 1201, a reticle 1202, a projection optical system 1203, a substrate 1204, and a stage 1205. The illumination optical system 1201 can employ, as exposure light, e.g., ultraviolet rays which use an excimer laser, a fluorine excimer laser, or the like, as a light source. Light emitted from the illumination optical system 1201 illuminates the reticle 1202. The light having passed through the reticle 1202 is focused on the substrate 1204 through the projection optical system 1203 to expose a photosensitive material applied on the substrate 1204. The substrate 1204 is moved to a predetermined position using the alignment apparatus according to the present invention.

Figure 13:
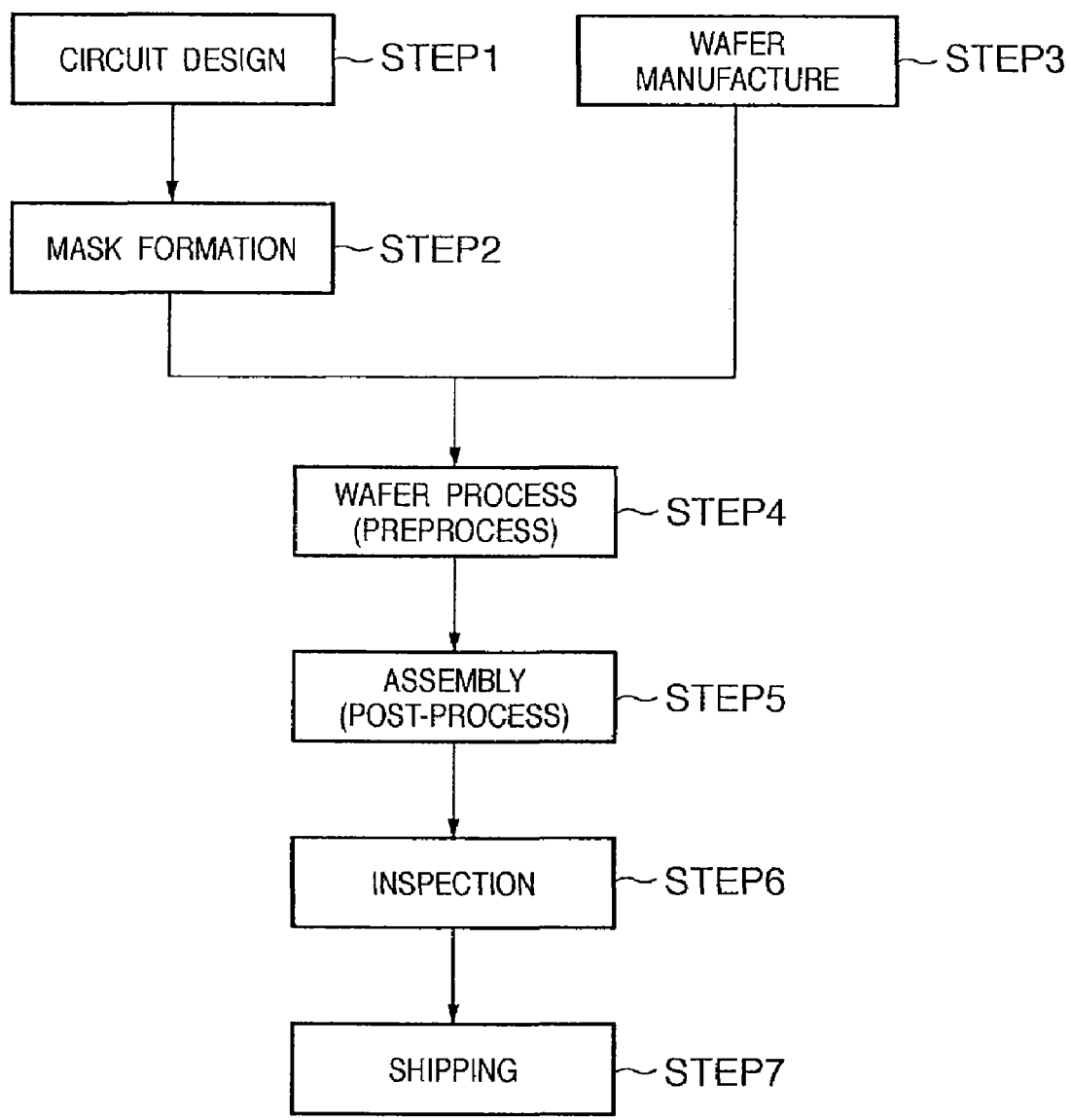
FIG. 13 is a flow chart showing the flow of the whole manufacturing process of a semiconductor device.

FIG. 13 shows the flow of the whole manufacturing process of the semiconductor device using the above-mentioned exposure apparatus. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections, such as an operation confirmation test and a durability test. After these steps, the semiconductor device is completed and shipped (step 7).

Figure 14:
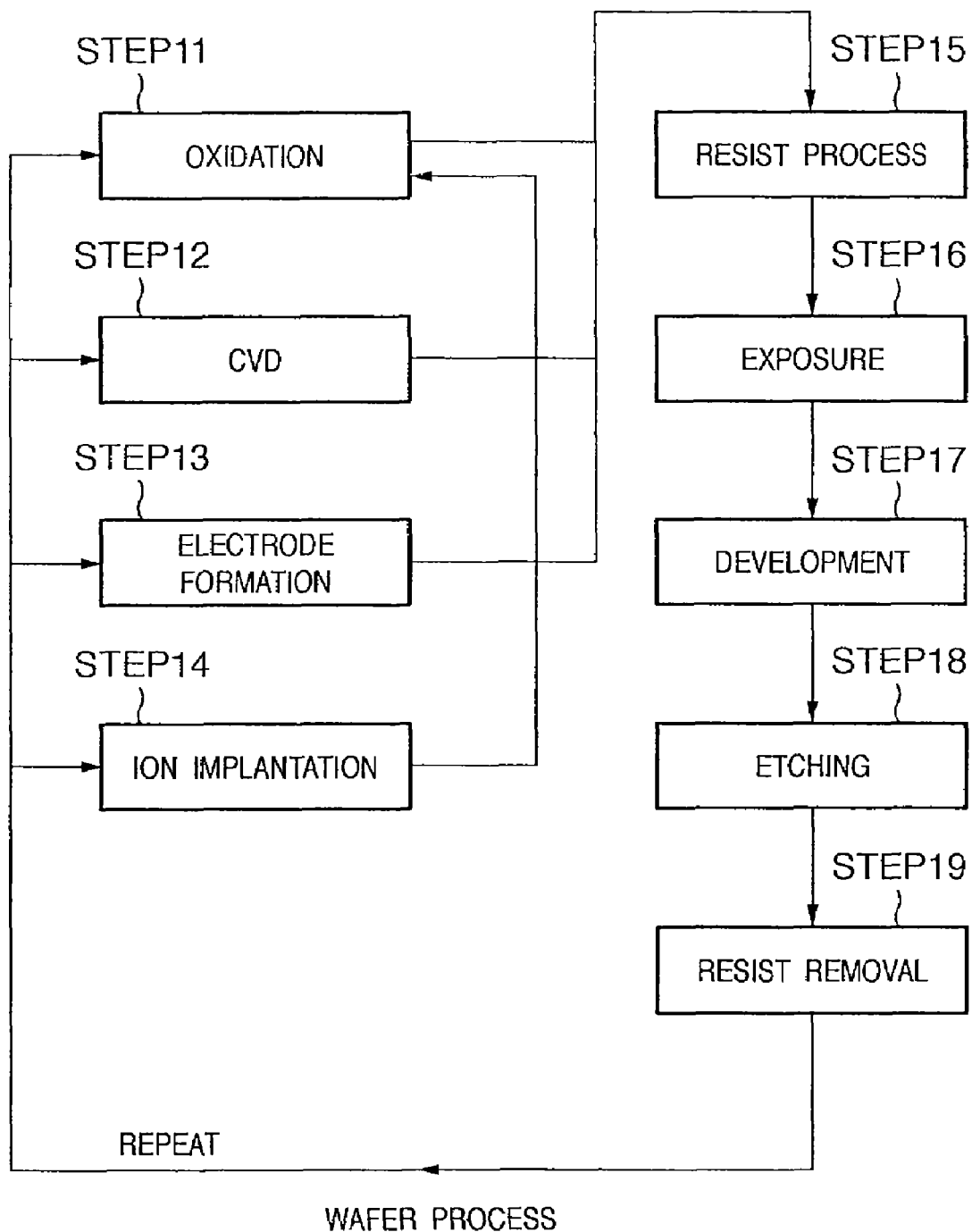
FIG. 14 is a flow chart showing the detailed flow of the wafer process.

FIG. 14 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the wafer is moved at high precision using the above-mentioned exposure apparatus, and the circuit pattern is transferred onto the wafer. In step 17 (development), the exposed wafer is developed. In step 18 (etching), the resist is etched except for the developed resist image. In step 19 (resist removal), any unnecessary resist after etching is removed. These steps are repeated to form multiple circuit patterns on the wafer.

With the above-mentioned process, a wafer can be moved at a high precision in the exposure step, and a circuit pattern can be transferred onto the wafer.

According to the present invention, an alignment apparatus and its control method, which suppress errors caused by the switching of measurement devices during stage driving, an exposure apparatus, and a method of manufacturing a semiconductor device using an exposure apparatus controlled by the control method, can be provided.

As many apparently widely different embodiments of the present invention can be made without departing from the spirit and scope thereof, it is to be understood that the invention is not limited to the specific embodiments thereof except as defined in the claims.

What is claimed is:

1. An apparatus comprising:
   a stage configured to be moved;
   a first laser interferometer configured to be used to measure a position of the stage in a first direction;
   a second laser interferometer configured to be used to measure a position of the stage in the first direction; and
   a control unit configured (i) to obtain a position of the stage based on an output of one of the first and second laser interferometers, (ii) to control a position of the stage based on the obtained position of the stage, (iii) to perform switching of one of the first and second laser interferometers to the other of the first and second laser interferometers while the stage is moved at a constant velocity in the first direction, (iv) to calculate a distance by which the stage is to be moved during a time interval, and (v) to set an initial value of the other of the first and second laser interferometers after the switching, based on a position measured by the one of the first and second laser interferometers at a start time of the time interval and the calculated distance.

2. An apparatus according to claim 1, wherein the control unit is configured to calculate the constant velocity using previous outputs of the one of the first and second laser interferometers, and to calculate the distance by a product of the calculated constant velocity and the time interval.

3. An apparatus according to claim 1, wherein the control unit is configured to calculate, as the distance, a distance by which the stage has been moved during the time interval using previous outputs of the one of the first and second laser interferometers.

4. An apparatus according to claim 1, further comprising a third laser interferometer configured to be used to measure a position of the stage in a second direction orthogonal to the first direction,
   wherein the control unit is configured to perform the switching based on the position measured by the third laser interferometer.

5. An apparatus according to claim 1, wherein the control unit is configured to perform the switching while the stage is moved at the constant velocity based on a preset profile of a change in a velocity of the stage.

6. An apparatus according to claim 1, wherein the control unit is configured to preset a profile of a change in a velocity of the stage so that the switching is performed while the stage is moved at the constant velocity.

7. An apparatus according to claim 1, wherein the stage is configured to chuck a substrate , and the apparatus is configured to perform exposure of a shot on the chucked substrate to a pattern of light.

8. An apparatus according to claim 7, wherein the control unit is configured to perform the switching while the stage is moved at the constant velocity, without the exposure of the shot.

9. An apparatus according to claim 8, wherein the control unit is configured to preset a profile of a change in a velocity of the stage, so that the switching is performed while the stage is moved at the constant velocity, without the exposure of the shot.

10. A method of manufacturing a device, the method comprising:
   (a) exposing a shot on a substrate to a pattern of light using an apparatus;
   (b) developing the exposed substrate; and
   (c) processing the developed substrate to manufacture the device,
   wherein the apparatus comprises:
      (i) a stage configured to chuck the substrate and to be moved;
      (ii) a first laser interferometer configured to be used to measure a position of the stage in a first direction;
      (iii) a second laser interferometer configured to be used to measure a position of the stage in the first direction; and
      (iv) a control unit configured to obtain a position of the stage based on an output of the first and second laser interferometers, to control a position of the stage based on the obtained position of the stage, to perform switching of one of the first and second laser interferometers to the other of the first and second laser interferometers while the stage is moved at a constant velocity in the first direction, to calculate a distance by which the stage is to be moved during a time interval, and to set an initial value of the other of the first and second laser interferometers after the switching, based on a position measured by the one of the first and second laser interferometers at a start time of the time interval and the calculated distance.

* * * * *